United States Patent
Hokazono

(10) Patent No.: US 8,049,280 B2
(45) Date of Patent: Nov. 1, 2011

(54) SEMICONDUCTOR DEVICE AND METHOD OF FABRICATING THE SAME

(75) Inventor: Akira Hokazono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 12/491,674

(22) Filed: Jun. 25, 2009

(65) Prior Publication Data

US 2010/0252869 A1 Oct. 7, 2010

(30) Foreign Application Priority Data

Apr. 3, 2009 (JP) ................................. 2009-091447

(51) Int. Cl.
*H01L 21/8238* (2006.01)
(52) U.S. Cl. ............... 257/369; 257/382; 257/E21.619; 257/E21.634; 438/199; 438/938; 438/300
(58) Field of Classification Search .................. 257/368, 257/369, 384, E21.611, E21.619, E21.632, 257/E21.634, E27.062; 438/199, 938, 682, 438/300
See application file for complete search history.

(56) References Cited

U.S. PATENT DOCUMENTS

2004/0262694 A1* 12/2004 Chidambaram ............. 257/369
2008/0199999 A1* 8/2008 Weijtmans et al. ........... 438/285

OTHER PUBLICATIONS

Hiroshi Itokawa et al., "Source/Drain Engineering for MOSFETs with e-Si: C Technology", Applied Surface Science, vol. 234, Issue 19. Jul. 30, 2008, 2 pages.
Tsung-Yang Liow, et al., "Strained N-Channel FinFETs with High-stress Nickel Silicide-Carbon Contacts and Integration with FUSI Metal Gate Technology", Extended Abstracts of the 2007 International Conference on Solid State Devices and Materials, Tsukuba, 2007, pp. 872-873.

* cited by examiner

*Primary Examiner* — Victor A Mandala
*Assistant Examiner* — Scott Stowe
(74) *Attorney, Agent, or Firm* — Oblon, Spivak, McClelland, Maier & Neustadt, L.L.P.

(57) ABSTRACT

A semiconductor device according to one embodiment includes: a gate electrode formed on a semiconductor substrate via a gate insulating film; Si:C layers formed on the semiconductor substrate in sides of the gate electrode; p-type source/drain regions formed in sides of the gate electrode in the semiconductor substrate, and a part of the p-type source/drain regions being formed in the Si:C layers; and silicide layers formed on the Si:C layers.

14 Claims, 12 Drawing Sheets

US 8,049,280 B2

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2009-91447, filed on Apr. 3, 2009, the entire contents of which are incorporated herein by reference.

BACKGROUND

A conventional transistor is known in which metal silicide is formed on a gate electrode or source/drain regions in order to reduce electric resistance thereof.

In order to form an upper member of a transistor such as a capacitor, etc., under high temperature conditions, each member composing a transistor is required to have thermal stability, however, the thermal stability of commonly used metal silicide such as Ni silicide, etc., is not high.

On the other hand, it is known that the thermal stability of the Ni silicide is improved by forming the Ni silicide on a Si:C crystal. This technique, for example, is disclosed in a non-patent literary document of Liow et al. "Strained N-channel FinFETs with High-stress Nickel Silicide-Carbon Contacts and Integration with FUSI Metal Gate Technology", Extended Abstracts of the 2007 International Conference on Solid State Devices and Materials, Tsukuba, 2007, pp. 872-873.

BRIEF SUMMARY

A semiconductor device according to one embodiment includes: a gate electrode formed on a semiconductor substrate via a gate insulating film; Si:C layers formed on the semiconductor substrate in sides of the gate electrode; p-type source/drain regions formed in sides of the gate electrode in the semiconductor substrate, and a part of the p-type source/drain regions being formed in the Si:C layers; and silicide layers formed on the Si:C layers.

A semiconductor device according to another embodiment includes: a gate electrode formed on a semiconductor substrate via a gate insulating film; Si:C layers formed in sides of the gate electrode in the vicinity of a surface of the semiconductor substrate, wherein a C concentration is 0.05 At % or less; p-type source/drain regions formed on the both sides of the gate electrode in the semiconductor substrate and in the Si:C layers; and silicide layers formed on the Si:C layers.

A method of fabricating a semiconductor device according to another embodiment includes: forming a gate electrode on a semiconductor substrate via a gate insulating film; forming Si:C layers on the semiconductor substrate in sides of the gate electrode, or, by an ion implantation method, in sides of the gate electrode in the vicinity of the surface of the semiconductor substrate; forming at least a portion of a source/drain region by implanting a p-type impurity into the Si:C layer and the semiconductor substrate; and forming silicide layers by siliciding at least a portion of the Si:C layers.

DETAILED DESCRIPTION

First Embodiment

Figure 1:
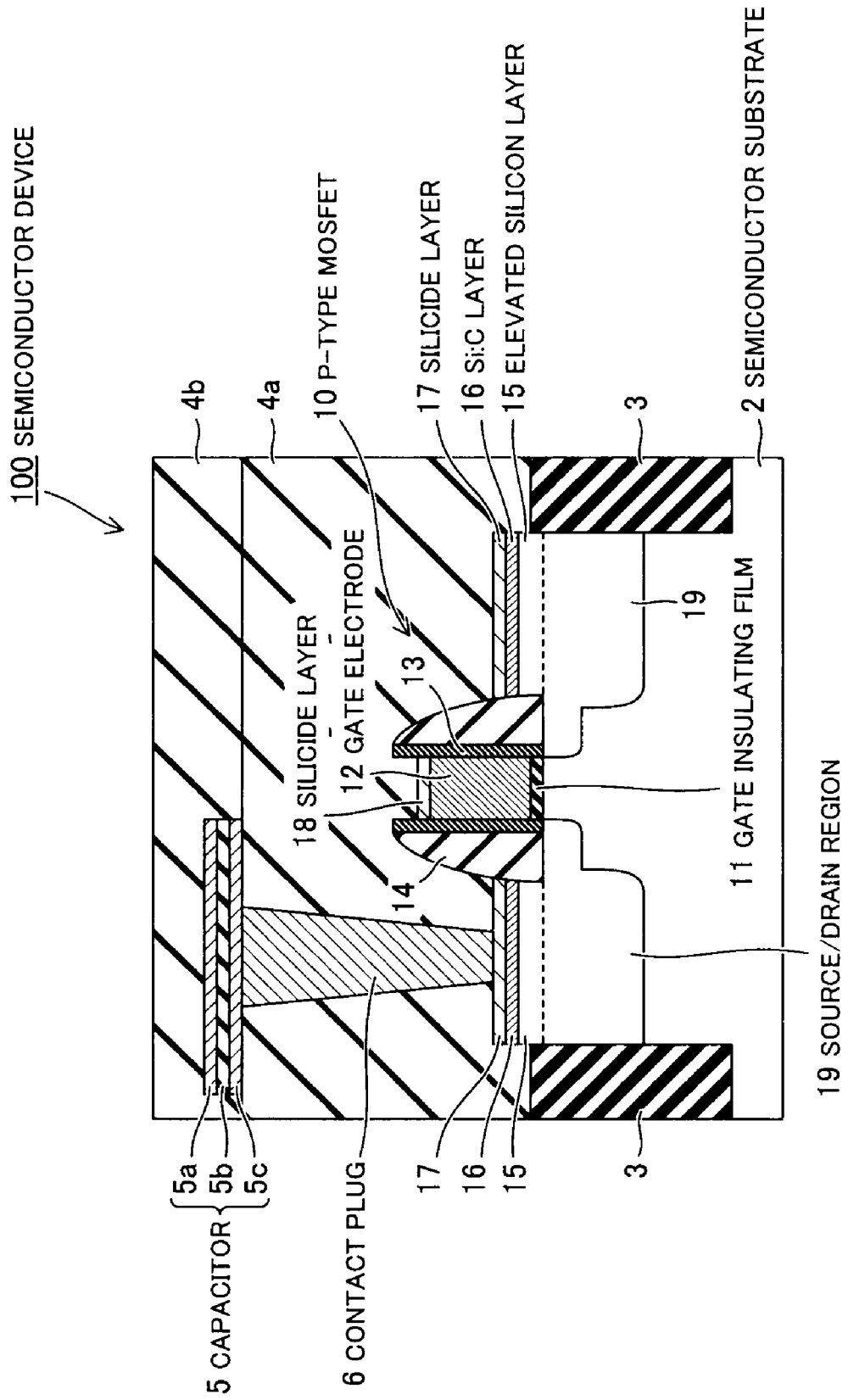
FIG. 1 is a cross sectional view showing a semiconductor device according to a first embodiment.

FIG. 1 is a cross sectional view showing a semiconductor device 100 according to the first embodiment. The semiconductor device 100 includes a p-type MOSFET (Metal Oxide Semiconductor Field Effect Transistor) 10 formed on a semiconductor substrate 2, an element isolation region 3 for isolating the p-type MOSFET 10 from other elements, interlayer insulating films 4a and 4b formed on the p-type MOSFET 10, a capacitor 5 formed in the interlayer insulating film 4b, and a contact plug 6 formed in the interlayer insulating film 4a for connecting a source/drain region 19 of the p-type MOSFET 10 with the capacitor 5.

The semiconductor substrate 2 is made of a Si-based crystal such as a Si crystal, etc.

The element isolation region 3 is made of, e.g., an insulating material such as $SiO_2$, etc., and has a STI (Shallow Trench Isolation) structure having a depth of 200-300 nm.

The interlayer insulating films 4a and 4b are made of an insulating material such as TEOS, BPSG (Boron Phosphor Silicate Glass) or SiN, etc.

The capacitor 5 is composed of an upper electrode 5a, a lower electrode 5c, and an insulating film 5b sandwiched therebetween. The upper electrode 5a and the lower electrode 5c are made of a conductive material such as TiN or W, etc., and the insulating film 5b is made of an insulating material such as $Ta_2O_3$, $ZrO_3$ or HfSiON, etc.

The contact plug 6 is made of, e.g., a conductive material such as W, etc., coated with a barrier metal made of Ti or TiN, etc.

The p-type MOSFET 10 includes a gate electrode 12 formed on the semiconductor substrate 2 via a gate insulating film 11, offset spacers 13 formed on both side faces of the gate electrode 12, gate sidewalls 14 formed on side faces of the offset spacers 13, elevated silicon layers 15 formed on the semiconductor substrate 2 on both sides of the gate sidewalls 14, Si:C layers 16 formed on the elevated silicon layers 15, silicide layers 17 formed on the Si:C layers 16, a silicide layer 18 formed on the gate electrode 12, and source/drain regions 19 formed on the both sides of the gate electrode 12.

The gate insulating film 11 is made of, e.g., an insulating material such as $SiO_2$, SiN or SiON, etc., or a high-dielectric material such as HfSiON, etc. In addition, the gate insulating film 11 is, e.g., 0.5-6 nm in thickness.

The gate electrode 12 is made of, e.g., a Si-based polycrystal such as polycrystalline Si or polycrystalline SiGe, etc., containing a conductivity type impurity. Alternatively, the gate electrode 12 may be a metal gate electrode made of a metal, furthermore, may have a structure of two layers composed of a metal layer and a Si-based polycrystalline layer thereon. Note that, when the gate electrode 12 is a metal gate electrode, the silicide layer 18 on the gate electrode 12 is not formed. In addition, the gate electrode 12 is, e.g., 50-200 nm in thickness.

The offset spacer 13 and the gate sidewall 14 are made of an insulating material such as $SiO_2$ or SiN, etc. Alternatively, the gate sidewall 14 may have a structure of two layer made of multiple types of insulating material such as SiN, $SiO_2$, TEOS (Tetraethoxysilane), etc., furthermore, may have a structure of three or more layers.

The elevated silicon layer 15 is made of a Si-based crystal such as a Si crystal, etc., and can be formed by using the same material as the semiconductor substrate 2. In addition, the elevated silicon layer 15 is formed by epitaxial crystal growth, etc., using an upper surface of the semiconductor substrate 2 as a base. Note that, C in the Si:C layer 16 may be dispersed into the elevated silicon layer 15.

The Si:C layer 16 is made of a Si:C crystal. In addition, the Si:C layer 16 is formed by epitaxial crystal growth, etc., using an upper surface of the elevated silicon layer 15 as a base. Since the Si:C layer 16 is formed on the semiconductor substrate 2 via the elevated silicon layer 15, a bottom of the Si:C layer 16 is located higher than a boundary between the semiconductor substrate 2 and the gate insulating film 11.

Since the Si: C crystal has a lattice constant smaller than that of the Si crystal, the Si:C crystal generates a strain in the Si crystal which lattice matches with the Si:C crystal. Thus, when a distance between the Si:C layer 16 and a channel region of the p-type MOSFET 10 in the semiconductor substrate 2 is small, there is a possibility that the Si:C layer 16 generates a tensile strain in a channel direction in the channel region, which may reduce carrier (hole) mobility. Now therefore, the Si:C layer 16 is formed on the semiconductor substrate 2 via the elevated silicon layer 15 as is the present embodiment so that a strain generated in the Si:C layer 16 does not affect the channel region in the semiconductor substrate 2, and it is thereby possible to suppress decrease in the carrier mobility.

Note that, the Si:C layer 16 may be formed directly on the semiconductor substrate 2 without forming the elevated silicon layer 15. Even in such a case, it is possible to suppress application of a stress to the channel region as compared with the case that the Si:C layer 16 is embedded into the semiconductor substrate 2. However, it is preferable to form the elevated silicon layer 15 in order to suppress deterioration of transistor characteristics caused by forming the Si:C layer 16.

A C concentration in the Si:C layer 16 is preferably 3.0 At % or less. This is because, when the C concentration is higher than 3.0 At %, crystal defects are more likely to be generated. Note that, an effect of improving the thermal stability of the Si:C layer 16 is obtained if the Si:C layer 16 contains even a very slight amount of C.

Furthermore, it is preferable to reduce the C concentration at a substitution site of the Si crystal for reducing a strain generated in the semiconductor substrate 2. While ensuring thermal stability of the silicide layer 17 by decreasing the C concentration at the substitution site of the Si crystal and increasing a ratio of the C implanted at an interstitial site, it is possible to suppress decrease in the carrier mobility by reducing the strain generated in the channel region in the semiconductor substrate 2.

By controlling a flow rate or partial pressure of a material gas of C such as $SiH_3CH_3$, etc., to an appropriate magnitude when the Si:C crystal is grown by the epitaxial crystal growth method, it is possible to form the Si:C layer 16 in which the C concentration of the Si crystal at the substitution site is low. For example, the flow rate is controlled to be about 0.03 slm. Alternatively, the partial pressure is controlled to be about 20 Torr. In addition, by epitaxially growing the Si:C crystal under high temperature conditions of 600° C. or more, it is possible to form the Si:C layer 16 in which the C concentration of the Si crystal at the substitution site is low. In this regard, however, in order to suppress impurity diffusion in an extension region of the source/drain region 19, the temperature condition is preferably no more than 850° C. In addition, it is possible to lower the C concentration at the substitution site of the Si crystal in the Si:C layer 16 also in case that the Si:C layer 16 is formed by implanting C into the elevated silicon layer 15 using an ion implantation method.

Particularly, in order to effectively suppress the decrease in the carrier mobility, the C concentration at the substitution site of the Si crystal in the Si:C layer 16 is preferably 0.05 At % or less. Note that, the C concentration at the interstitial site in the Si:C layer 16 can be accurately analyzed by using XRD (X-Ray Diffraction) with respect to a wide pattern region. Alternatively, a certain degrees of C concentration can be estimated from a stress applied to a channel portion by means of measurement such as NBD (Nano-Beam Diffraction), etc. In addition, the whole C concentration in the Si:C layer 16 can be accurately analyzed by using SIMS (Secondary Ion Mass Spectrometry) with respect to a wide pattern region, or alternatively, can be derived by means of measurement such as EDX (Energy Dispersive X-ray Spectrometry), etc.

The silicide layers 17 and 18 are made of metal silicide containing a metal such as Ni, Co, Er, Pt or Pd, etc., and reduce each electric resistance of the source/drain region 19 and the gate electrode 12.

Since the silicide layer 17 is formed on the Si:C layer 16, the silicide layer 17 is excellent in thermal stability compared with the metal silicide formed on a layer made of a Si crystal.

The source/drain region 19 is formed by implanting a p-conductivity type impurity such as B or $BF_2$, etc., into the semiconductor substrate 2, the elevated silicon layer 15 and the Si:C layer 16.

An example of a method of fabricating a semiconductor device 100 according to the present embodiment will be described hereinafter.

FIGS. 2A to 2H are cross sectional views showing processes for fabricating the semiconductor device 100 according to the first embodiment.

Figure 2A:
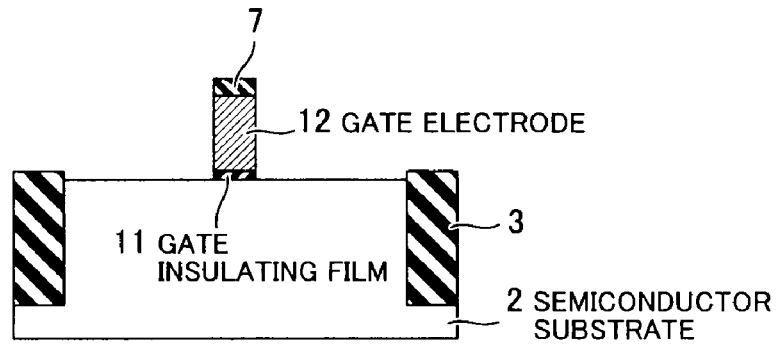
FIGS. 2A to 2H are cross sectional views showing processes for fabricating the semiconductor device according to the first embodiment.

Firstly, as shown in FIG. 2A, the element isolation region 3 is formed in the semiconductor substrate 2, subsequently, an ion is implanted into a well and a channel region and heat treatment such as RTA (Rapid Thermal Annealing), etc., is carried out, and then, the gate insulating film 11, the gate electrode 12 and a cap film 7 are formed.

In addition, as for a formation condition of an n-type well and a n-type channel region after forming the element isolation region 3, for example, when the n-type well is formed using P, the ion implantation is carried out under a condition at an implantation energy of 500 KeV and an implantation dose of $3.0 \times 10^{13}$ $cm^{-2}$. When the n-type channel region is formed using As, ion implantation is carried out under a condition at an implantation energy of 60 KeV and an implantation dose of $1.5 \times 10^{13}$ $cm^{-2}$. Note that, these ion implantations are carried out through a 10 nm or less thick natural oxide film on the semiconductor substrate 2.

The gate insulating film 11, the gate electrode 12 and the cap film 7 are formed by, e.g., following method. Firstly, after forming the well and the channel region, the natural oxide film on the semiconductor substrate 2 is removed, a material film of the gate insulating film 11 such as a $SiO_2$ film, etc., is formed on the semiconductor substrate 2 by a thermal oxidation method and a LPCVD (Low-Pressure Chemical Vapor Deposition) method, etc., and then, a material film of the gate electrode 12 such as a polycrystalline Si film, etc., and a material film of the cap film 7 such as SiN, etc., are formed thereon by the LPCVD method. Next, the laminated material films are patterned by a combination of a RIE (Reactive Ion Etching) method with an optical lithography method, an X-ray lithography method, or an electron beam lithography method, and thereby shaped into the cap film 7, the gate electrode 12 and the gate insulating film 11.

Figure 2B:
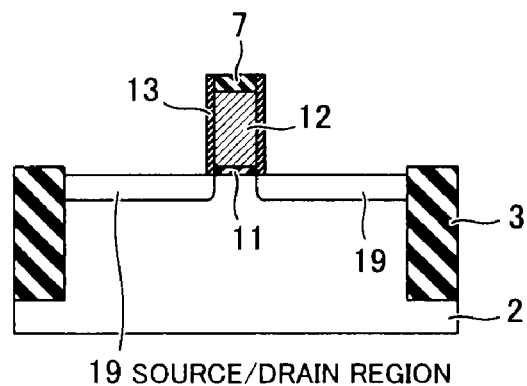

Next, as shown in FIG. 2B, the offset spacers 13 and a shallow region of a p-type source/drain region 19 are formed.

Concretely, for example, after forming a 1-2 nm thick $SiO_2$ film (not shown) on a surface of the gate electrode 12 by thermal oxidation method, a $SiO_2$ film, etc., is formed thereon in a thickness of 3-12 nm by the LPCVD method. Then, these films are shaped into the offset spacer 13 by the RIE method. After that, a conductivity type impurity is implanted into the whole surface of the semiconductor substrate 2 by the ion implantation method using the offset spacers 13 and the cap film 7 as a mask, which results in that a halo region (not shown) and a shallow region of the source/drain region 19 are formed. Furthermore, heat treatment such as spike annealing, etc., is carried out for activating the implanted conductivity type impurity.

Here, when the halo region is formed using As, ion implantation is carried out under a condition, e.g., at an implantation energy of 40 KeV, an implantation dose of $3.0 \times 10^{13}$ $cm^{-2}$ and an implantation angle of 30° (an angle with reference to a direction vertical to the surface of the semiconductor substrate 2). Meanwhile, when the shallow region of the source/drain region 19 is formed using $BF_2$, the ion implantation is carried out under a condition, e.g., at an implantation energy of 1-3 KeV and an implantation dose of $5.0 \times 10^{14}$ to $1.5 \times 10^{15}$ $cm^{-2}$.

Figure 2C:
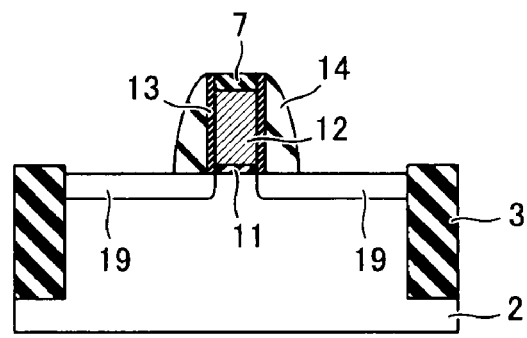

Next, as shown in FIG. 2C, the gate sidewalls 14 are formed.

Concretely, for example, a $SiO_2$ film, etc., is formed on the whole surface of the semiconductor substrate 2 by the LPCVD method and is subsequently shaped into the gate sidewall 14 by the RIE method.

Figure 2D:
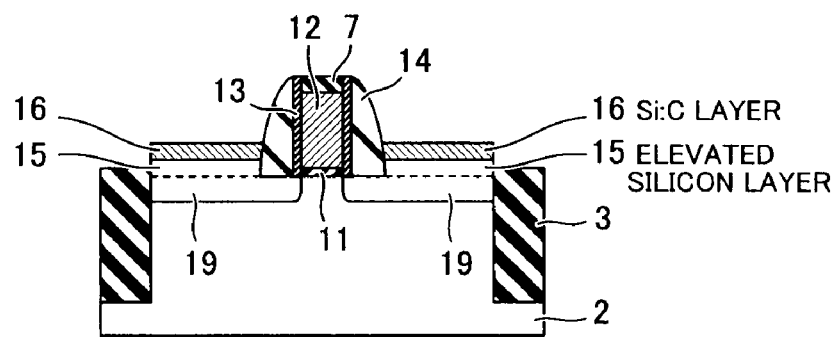

Next, as shown in FIG. 2D, the elevated silicon layers 15 and the Si:C layers 16 are formed on the semiconductor substrate 2 on both sides of the gate sidewalls 14.

Concretely, for example, the semiconductor substrate 2 is heated in a hydrogen atmosphere under high temperature of 700° C. or more, and material gas of Si such as $SiH_4$, $SiH_2Cl_2$ or $SiHCl_3$, etc., is supplied on the semiconductor substrate 2 with HCl gas and hydrogen gas for epitaxially growing a Si crystal, thereby forming the elevated silicon layer 15. In addition, the Si:C layer 16 can be formed under the same condition as that for the elevated silicon layer 15 by using $SiH_3Cl_3$ in addition to the above-mentioned gases.

Alternatively, the Si:C layer 16 may be formed by ion-implanting C into the vicinity of a surface of the elevated silicon layer 15 which is made of a Si crystal. In this case, the ion implantation is carried out under a condition, e.g., at an implantation energy of 5 KeV and an implantation dose of $5.0 \times 10^{13}$ $cm^{-2}$. When the Si:C layer 16 is formed by ion implantation of C, it is preferable that the elevated silicon layer 15 is formed thicker compared with the case that the Si:C layer 16 is formed by epitaxial growth.

Figure 2E:
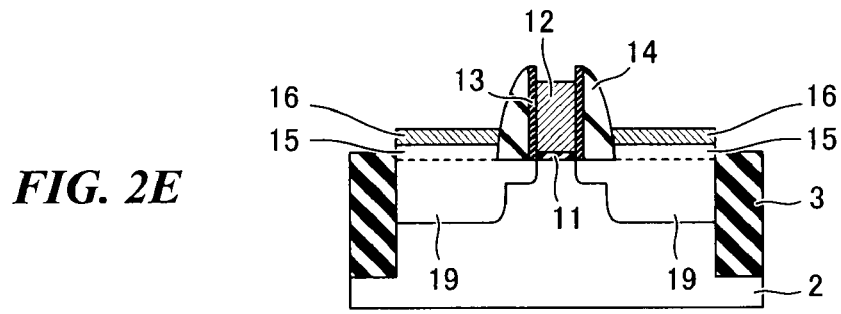

Next, as shown in FIG. 2E, a deep high-concentration region of the p-type source/drain region 19 is formed after removing the cap film 7.

Concretely, for example, after removing the cap film 7 by the RIE method or a wet etching method using phosphoric acid heated to 170° C., a conductivity type impurity is implanted into the whole surface of the semiconductor substrate 2 by the ion implantation method using the offset spacers 13 and the gate sidewalls 14 as a mask, which results in that the deep high-concentration region of the p-type source/drain region 19 is formed. Furthermore, heat treatment such as spike annealing, etc., is carried out for activating the implanted conductivity type impurity.

Figure 2F:
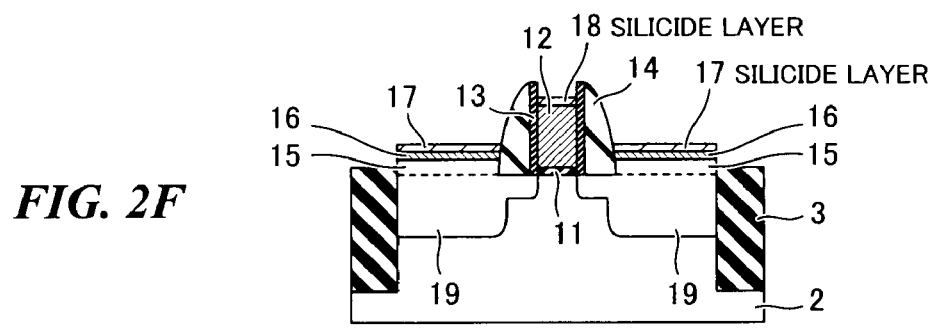

Next, as shown in FIG. 2F, the silicide layers 17 and the silicide layer 18 are respectively formed on the Si:C layers 16 and the gate electrode 12.

An example of a method of forming the silicide layers 17 and 18 made of Ni silicide will be described hereinafter. Firstly, the natural oxide films on the Si:C layers 16 and on the gate electrode 12 are removed by dilute hydrofluoric acid treatment. Next, after forming a Ni film on the whole surface of the semiconductor substrate 2 by the sputtering method, etc., silicidation reaction is generated between the Ni film and the Si:C layer 16 and between the Ni film and the gate electrode 12 by heat treatment such as the RTA, etc., under the temperature condition of 400-500° C., which results in that the silicide layers 17 and 18 are formed. Next, an unreacted portion of the Ni film is removed using a mixed solution of sulfuric acid and hydrogen peroxide solution.

Alternatively, a process in which a Ni film is formed and a TiN film is formed thereon, or, a process in which a Ni film is formed and is etched using a mixed solution of sulfuric acid and hydrogen peroxide solution after carrying out the low temperature RTA at 250-400° C. once and the RTA is carried out again at 400-550° C. for reducing sheet resistance (two step annealing), may be carried out.

Alternatively, the silicide layer 18 may be formed by a process separate from the process forming the silicide layer 17. As a result, it is possible to thicken the silicide layer 18. Unlike the silicide layer 17 on the source/drain region 19, a problem such as junction leakage is unlikely to occur in the silicide layer 18 even though thickened.

Figure 2G:
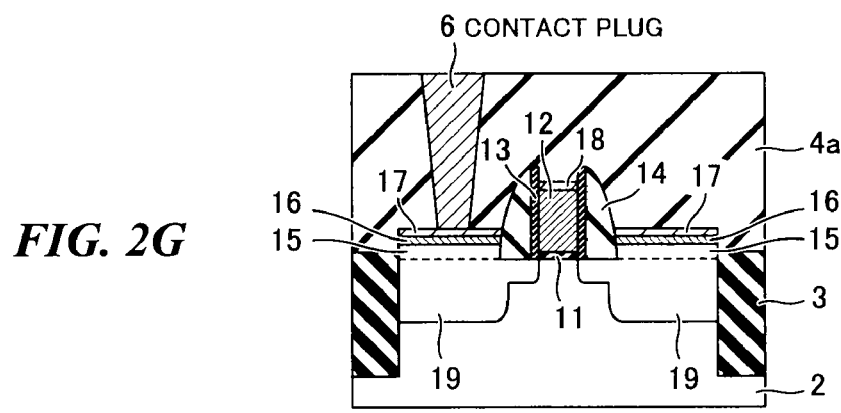

Next, as shown in FIG. 2G, the interlayer insulating film 4a and the contact plug 6 are formed.

An example of a specific method of forming these members will be described hereinafter. Firstly, a liner film (not shown) as an etching stopper is formed on the whole surface of the semiconductor substrate 2 by the CVD method, etc. Next, a material film of the interlayer insulating film 4a such as a TEOS film, etc., is formed on the liner film and is shaped into the interlayer insulating film 4a by planarization treatment such as CMP (Chemical Mechanical Polishing), etc. Next, a contact hole is formed in the interlayer insulating film 4a by a combination of the lithography method and the RIE method. Next, a material film of a barrier metal such as Ti, etc., and a material film of the contact plug 6 such as W, etc., are formed on the whole surface of the semiconductor substrate 2 so as to fill up the contact hole, and are shaped into the contact plug 6 having the barrier metal by planarization treatment such as CMP, etc.

Note that, a contact plug for connecting an upper wiring (not shown) with the source/drain region 19 and a contact plug for connecting an upper wiring (not shown) with the gate electrode 12 may be formed at the same time as the contact plug 6.

Figure 2H:
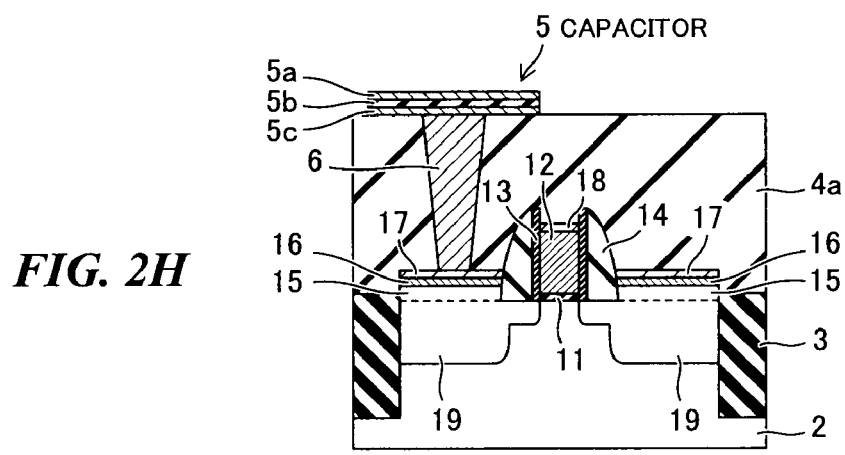

Next, as shown in FIG. 2H, the capacitor 5 connected to the upper surface of the capacitor 5 is formed.

An example of a specific method of forming the capacitor 5 will be described hereinafter. Firstly, material films of the lower electrode 5c, the insulating film 5b and the upper electrode 5a are formed on the whole surface of the semiconductor substrate 2 by a PVD (Physical Vapor Deposition) method or the CVD method. Next, these material films are shaped into the lower electrode 5c, the insulating film 5b and the upper electrode 5a by a combination of the lithography method and the RIE method, thereby obtaining the capacitor 5.

After that, the interlayer insulating film 4b is formed on the interlayer insulating film 4a.

Effect of the First Embodiment

According to the first embodiment, since the silicide layer 17 is formed on the Si:C layer 16, the silicide layer 17 has excellent thermal stability. Therefore, each upper member of the p-type MOSFET 10 can be formed under the high temperature conditions.

Particularly, when an upper capacitor of a transistor as is the capacitor 5 is formed, it is required to form a capacitor insulating film under a certain degree of high temperature conditions for ensuring dielectric constant of the capacitor insulating film and for suppressing generation of a gate leakage current from the capacitor. Note that, when the capacitor is formed in an upper layer of a transistor, a capacitor with a large capacity can be obtained relatively easily as compared with the case that the capacitor is formed in a lower layer (in a substrate) of the transistor.

In addition, according to the first embodiment, the Si:C layer 16 is formed on the semiconductor substrate 2 via the elevated silicon layer 15 so that a strain generated in the Si:C layer 16 does not affect the channel region in the semiconductor substrate 2, and it is thereby possible to suppress decrease in the carrier mobility.

In addition, the present invention is specifically effective when the silicide layer 17 is made of Ni silicide or Pt-doped Ni silicide. Since these metal silicides can be formed at low temperature and has excellent formability, a problem such as junction leakage, etc., is less likely to occur compared with the metal silicide such as Co silicide, etc., which is formed under the high temperature conditions. On the other hand, the thermal stability of the Ni silicide or the Pt-doped Ni silicide is relatively low. Thus, it is possible to compensate the weakness such as low thermal stability by applying the present embodiment.

Second Embodiment

The second embodiment is different from the first embodiment in the thickness of the silicide layer formed on the source/drain region. Note that, the explanation will be omitted or simplified for the same points as the first embodiment.

Figure 3:
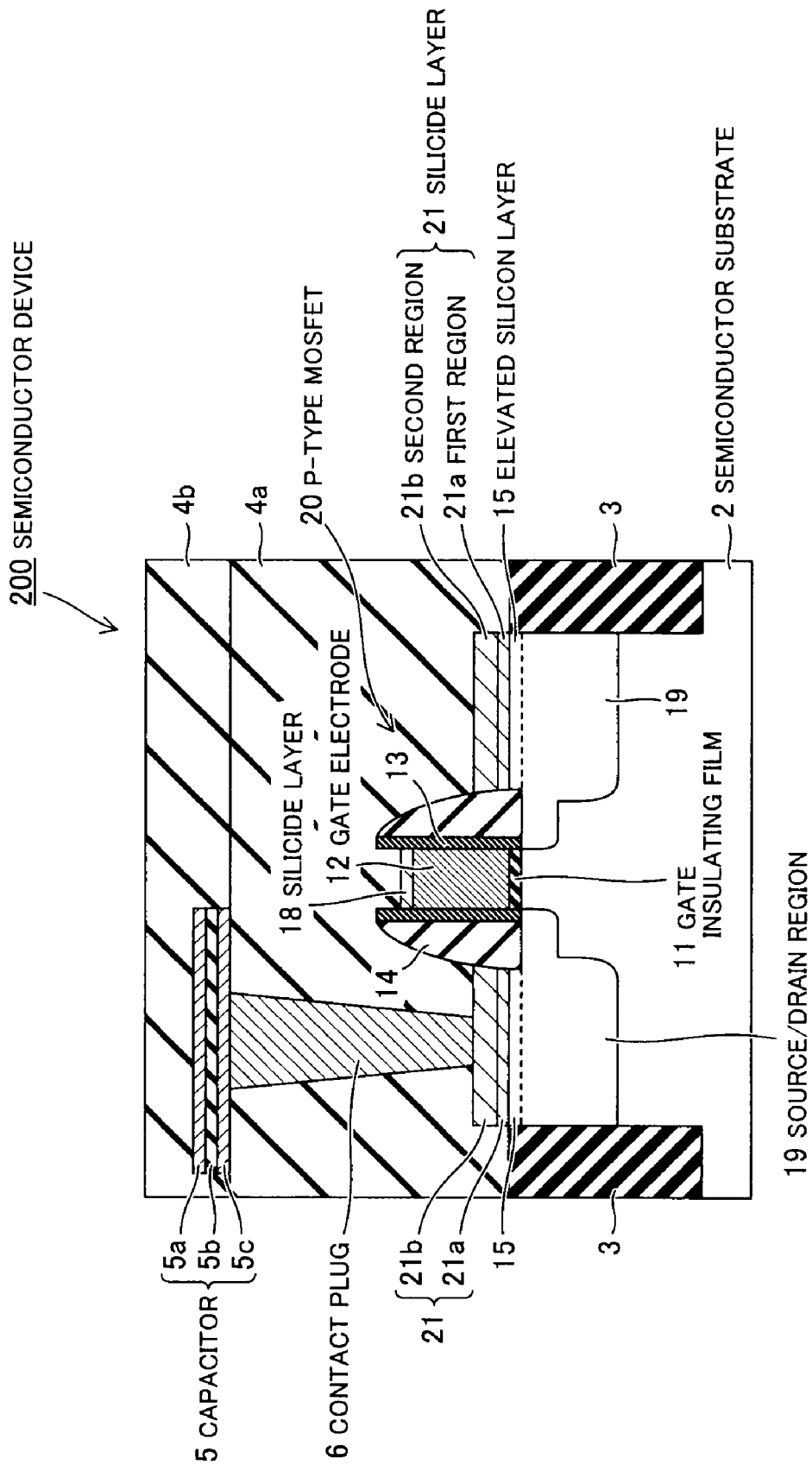
FIG. 3 is a cross sectional view showing a semiconductor device according to a second embodiment.

FIG. 3 is a cross sectional view showing a semiconductor device 200 according to the second embodiment. The semiconductor device 200 includes a p-type MOSFET 20 formed on a semiconductor substrate 2, an element isolation region 3 for isolating the p-type MOSFET 20 from other elements, interlayer insulating films 4a and 4b formed on the p-type MOSFET 20, a capacitor 5 formed in the interlayer insulating film 4b, and a contact plug 6 formed in the interlayer insulating film 4a for connecting a source/drain region 19 of the p-type MOSFET 20 with the capacitor 5.

The p-type MOSFET 20 includes a gate electrode 12 formed on the semiconductor substrate 2 via a gate insulating film 11, offset spacers 13 formed on both side faces of the gate electrode 12, gate sidewalls 14 formed on side faces of the offset spacers 13, elevated silicon layers 15 formed on the semiconductor substrate 2 on both sides of the gate sidewalls 14, a silicide layer 21 formed on the elevated silicon layers 15, a silicide layer 18 formed on the gate electrode 12, and source/drain regions 19 formed on the both sides of the gate electrode 12.

The silicide layer 21 is made of metal silicide containing a metal such as Ni, Co, Er, Pt or Pd, etc., and reduces electric resistance of the source/drain region 19.

The silicide layer 21 is composed of a first region 21a and a second region 21b thereon. The first region 21a is a region which is a silicided upper portion of the elevated silicon layer 15, and the second region 21b is a region which is the silicided Si:C layer 16. Thus, a concentration of C contained in the second region 21b is higher than that contained in the first region 21a.

Since the silicide layer 21 contains C, similarly to silicide layer 17 of the first embodiment, the silicide layer 21 is excellent in thermal stability.

In addition, electric resistance at an interface between the metal silicide and the Si crystal is smaller than that between the metal silicide and the Si:C crystal. Thus, the electric resistance at an interface between the silicide layer 21 and the elevated silicon layer 15 (or the semiconductor substrate 2) in the present embodiment is smaller than that between the silicide layer 17 and the Si:C layer 16 in the first embodiment, and it is thereby possible to reduce parasitic resistance.

The silicide layer 21 is formed by the same method as the silicide layer 17. In this regard, however, while the silicide layer 17 is formed by siliciding the upper portion of the Si:C layer 16, the silicide layer 21 is formed by siliciding the whole region of the Si:C layer 16 and the upper portion or the whole region of the elevated silicon layer 15. Alternatively, when the elevated silicon layer 15 is not formed, the silicide layer 21 is formed by siliciding the whole region of the Si:C layer 16 and the upper portion of the semiconductor substrate 2. For example, the thickness of a metal film such as a Ni film used for silicidation reaction is made thicker than the case that the silicide layer 17 is formed, thereby forming the silicide layer 21.

Note that, if the silicide layer 21 is too thick, the junction leakage is highly likely to occur, hence, it is preferable to provide a certain distance between the bottom of the silicide layer 21 and the bottom of the deep high-concentration region of the source/drain region 19.

Effect of the Second Embodiment

According to the second embodiment, parasitic resistance of the semiconductor device 200 is reduced more than that of the semiconductor device 100 of the first embodiment by forming the silicide layer 21 of which bottom is in contact with the elevated silicon layer 15 or the semiconductor substrate 2, and it is thereby possible to suppress deterioration of transistor characteristics.

Third Embodiment

The third embodiment is different from the first embodiment in that a crystal having a lattice constant larger than that of the Si crystal such as a SiGe crystal, etc., is embedded into the source/drain region for improving the carrier mobility. Note that, the explanation will be omitted or simplified for the same points as the first embodiment.

Figure 4:
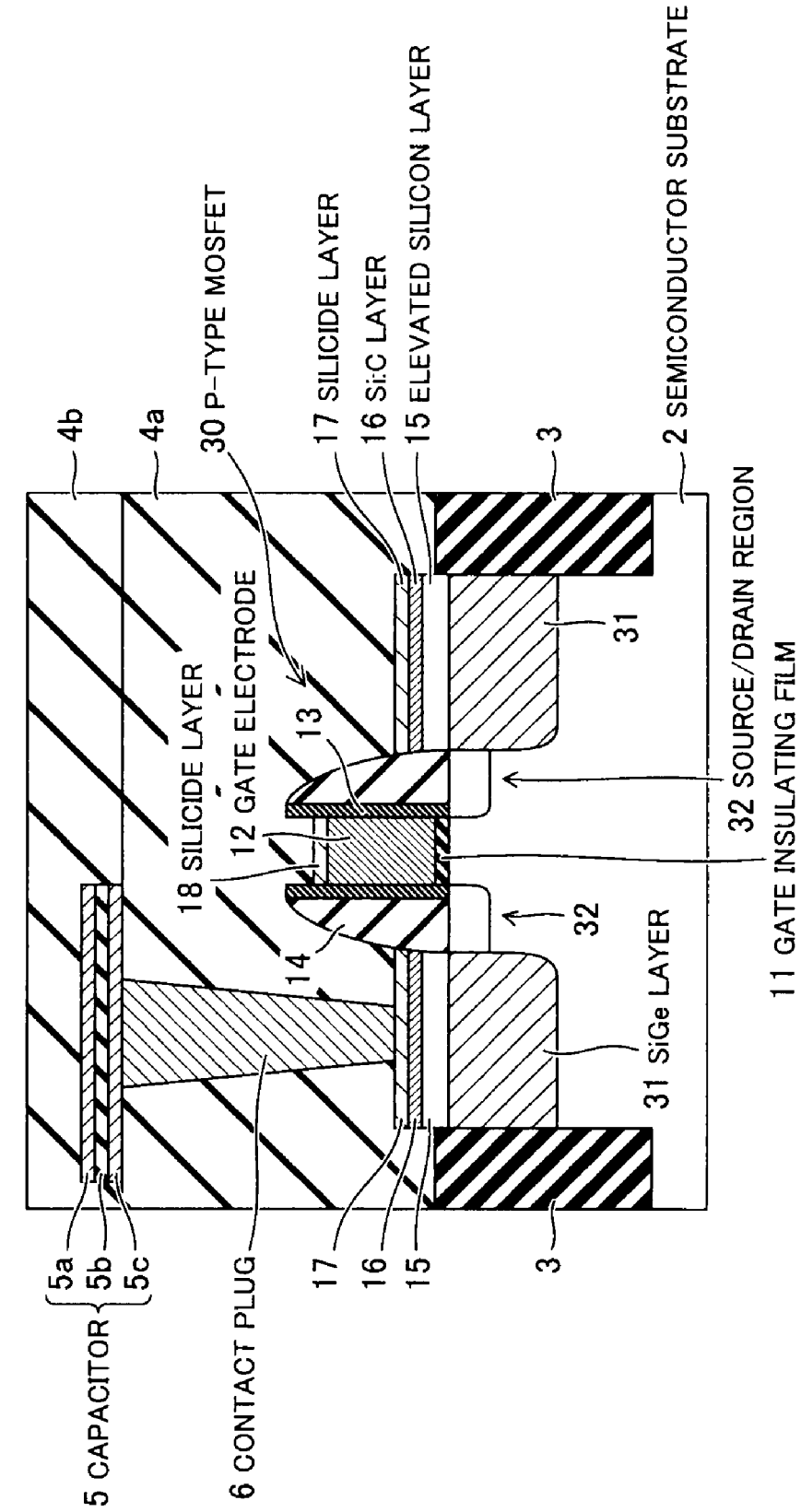
FIG. 4 is a cross sectional view showing a semiconductor device according to a third embodiment.

FIG. 4 is a cross sectional view showing a semiconductor device 300 according to the third embodiment. The semiconductor device 300 includes a p-type MOSFET 30 formed on a semiconductor substrate 2, an element isolation region 3 for isolating the p-type MOSFET 30 from other elements, interlayer insulating films 4a and 4b formed on the p-type MOSFET 30, a capacitor 5 formed in the interlayer insulating film 4b, and a contact plug 6 formed in the interlayer insulating film 4a for connecting a source/drain region 32 of the p-type MOSFET 30 with the capacitor 5.

The p-type MOSFET 30 includes a gate electrode 12 formed on the semiconductor substrate 2 via a gate insulating film 11, offset spacers 13 formed on both side faces of the gate electrode 12, gate sidewalls 14 formed on side faces of the offset spacers 13, source/drain regions 32 formed on both sides of the gate electrode 12, SiGe layers 31 embedded in regions corresponding to a deep high-concentration region of the source/drain region 32, elevated silicon layers 15 formed on the SiGe layers 31, Si:C layers 16 formed on the elevated silicon layers 15, silicide layers 17 formed on the Si:C layers 16, and a silicide layer 18 formed on the gate electrode 12.

Since the SiGe crystal has a lattice constant larger than that of the Si crystal, the SiGe crystal generates a strain in the Si crystal which lattice matches with the SiGe crystal. Thus, there is a possibility that the SiGe layer 31 generates a compressive strain in a channel direction in the channel region of the p-type MOSFET 30, thereby increasing carrier (hole) mobility. Alternatively, a layer made of another crystal having a lattice constant larger than that of the Si crystal may be used instead of the SiGe layer 31.

A Ge concentration contained in the SiGe layer 31 is preferably 10-40 At %. In addition, the SiGe layer 31 is used as a portion of the source/drain region 32.

Since the difference between the lattice constant of the SiGe crystal and that of the Si:C crystal is large, it is difficult to epitaxially grow the Si:C layer 16 directly on the SiGe layer 31. Therefore, the elevated silicon layer 15 is formed as a buffer layer between the SiGe layer 31 and the Si:C layer 16. Note that, either C in the Si:C layer 16 or Ge in the SiGe layer 31, or both of them may be dispersed into the elevated silicon layer 15.

An example of a method of fabricating a semiconductor device 300 according to the present embodiment will be described hereinafter.

FIGS. 5A to 5D are cross sectional views showing processes for fabricating the semiconductor device 300 according to the third embodiment.

Firstly, the processes until the process, shown in FIGS. 2A to 2C, for forming the gate sidewall 14 are carried out in the same way as the first embodiment. Note that, a shallow region of a source/drain region 32 is formed by the same method as the shallow region of the source/drain region 19 in the first embodiment.

Figure 5A:
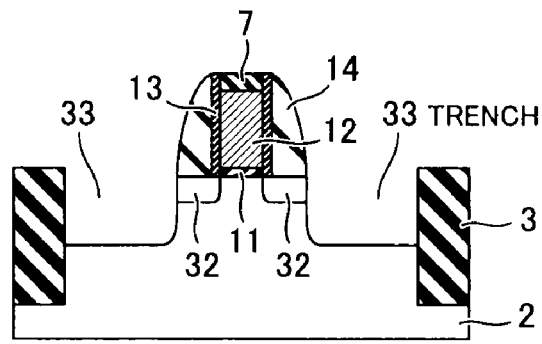
FIGS. 5A to 5D are cross sectional views showing processes for fabricating the semiconductor device according to the third embodiment.

Next, as shown in FIG. 5A, the semiconductor substrate 2 is etched by the RIE method, etc., using the cap film 7, the offset spacers 13 and the gate sidewalls 14 as a mask, thereby forming trenches 33.

Figure 5B:
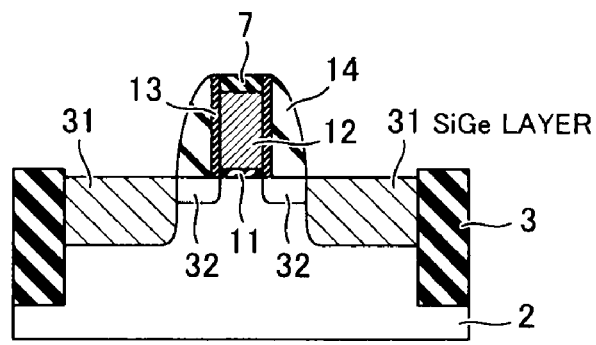

Next, as shown in FIG. 5B, a SiGe crystal is epitaxially grown so as to fill up the trenches 33 using the surface of the semiconductor substrate 2 exposed by the trenches 33 as a base, which results in that the SiGe layers 31 are formed. Note that, in situ doping of a p-conductivity type impurity may be carried out when growing the SiGe crystal.

Figure 5C:
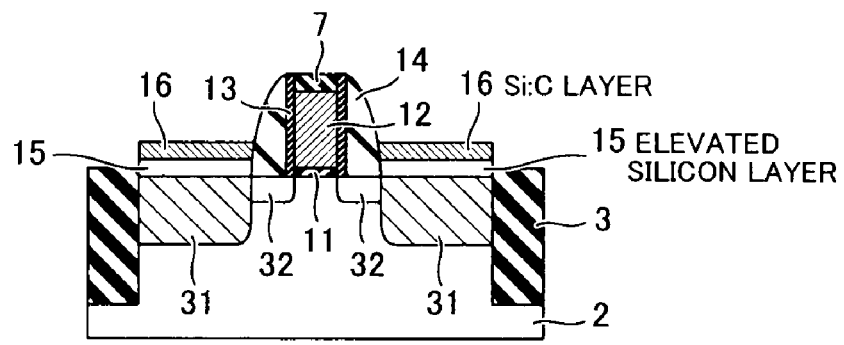

Next, as shown in FIG. 5C, the elevated silicon layers 15 and the Si:C layers 16 are formed on the SiGe layers 31.

Figure 5D:
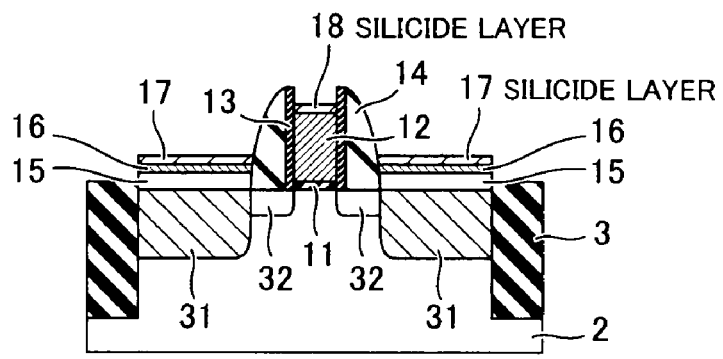

Next, as shown in FIG. 5D, the deep high-concentration regions of the p-type source/drain region 32 are formed after removing the cap film 7, and the silicide layers 17 and the silicide layer 18 are further formed.

Concretely, a conductivity type impurity is implanted into the whole surface of the semiconductor substrate 2 by the ion implantation method using the offset spacers 13 and the gate sidewalls 14 as a mask, which results in that the deep high-concentration region of the source/drain region 32 is formed in the Si:C layer 16, in the elevated silicon layer 15 and in the SiGe layer 31. Note that, the deep high-concentration region of the source/drain region 32 may be formed so as to reach the semiconductor substrate 2 under the SiGe layer 31. Furthermore, heat treatment such as spike annealing, etc., is carried out for activating the implanted conductivity type impurity. Note that, the method of removing the cap film 7 and the method of forming the elevated silicon layer 15, the Si:C layer 16, the silicide layers 17 and 18 are same as the first embodiment.

After that, the interlayer insulating films 4a, 4b, the contact plug 6 and the capacitor 5, etc., are formed in the same way as the first embodiment.

Effect of the Third Embodiment

According to the third embodiment, by forming the SiGe layer 31, it is possible to obtain an effect of increasing the carrier mobility in addition to the effect of the first embodiment.

Fourth Embodiment

The fourth embodiment is different from the first embodiment in that a Si:C layer and a silicide layer thereon are formed in the semiconductor substrate. Note that, the explanation will be omitted or simplified for the same points as the first embodiment.

Figure 6:
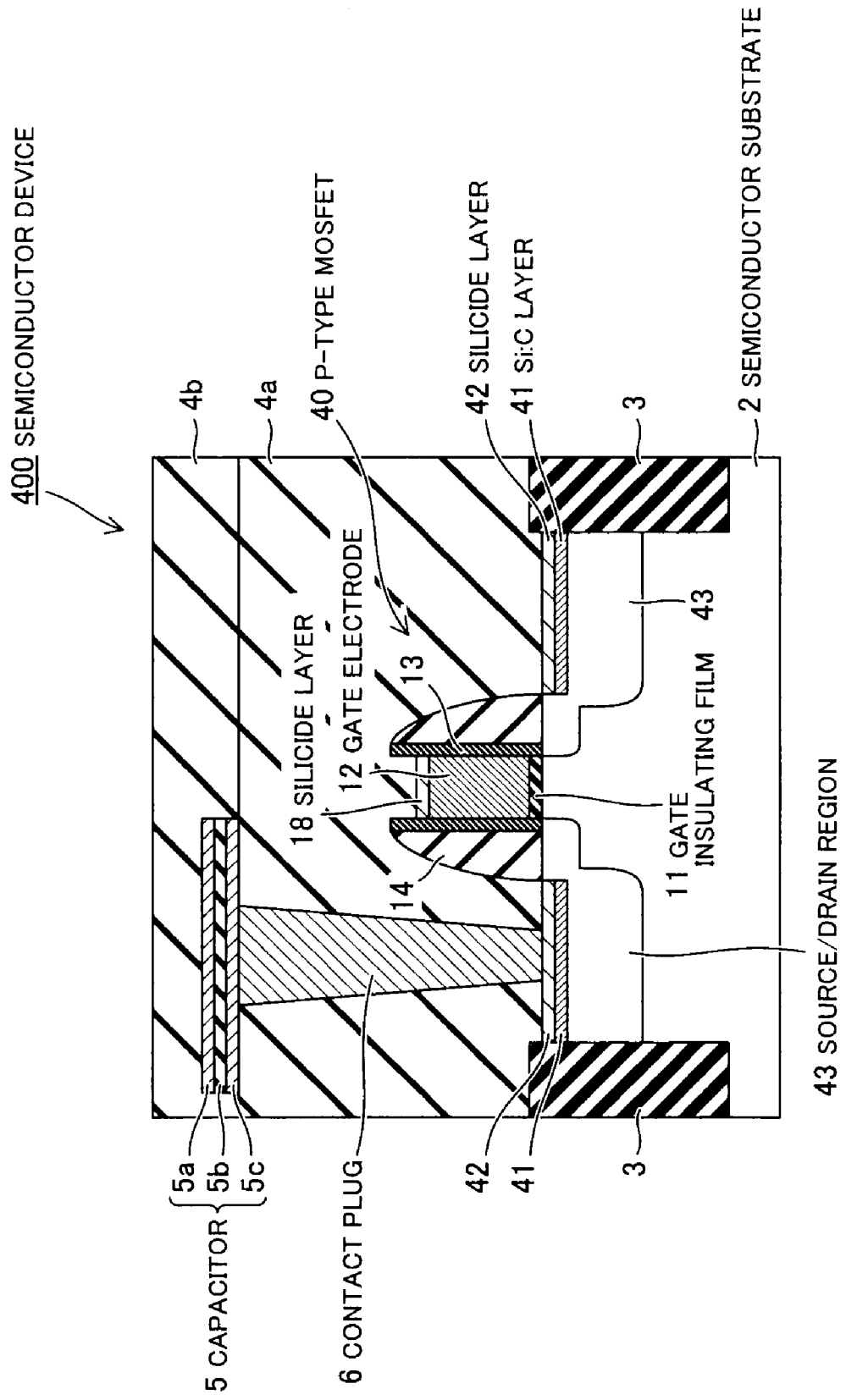
FIG. 6 is a cross sectional view showing a semiconductor device according to a fourth embodiment.

FIG. 6 is a cross sectional view showing a semiconductor device 400 according to the fourth embodiment. The semiconductor device 400 includes a p-type MOSFET 40 formed on a semiconductor substrate 2, an element isolation region 3 for isolating the p-type MOSFET 40 from other elements, interlayer insulating films 4a and 4b formed on the p-type MOSFET 40, a capacitor 5 formed in the interlayer insulating film 4b, and a contact plug 6 formed in the interlayer insulating film 4a for connecting a source/drain region 43 of the p-type MOSFET 40 with the capacitor 5.

The p-type MOSFET 40 includes a gate electrode 12 formed on the semiconductor substrate 2 via a gate insulating film 11, offset spacers 13 formed on both side faces of the gate electrode 12, gate sidewalls 14 formed on side faces of the offset spacers 13, Si:C layers 41 formed on both sides of the gate sidewalls 14 in the vicinity of the semiconductor substrate 2, silicide layers 42 formed on the Si:C layers 41, a silicide layer 18 formed on the gate electrode 12, and source/drain regions 43 formed on the both sides of the gate electrode 12.

In the Si:C layer 41, a C concentration at a substitution site of the Si crystal is low. Thus, a strain generate in the channel region by the Si:C layer 41 is reduced. Concretely, it is preferable that the C concentration of the whole Si:C layer 41 is 3.0 At % or less and the C concentration at the substitution site of the Si crystal is 0.05 At % or less.

The Si:C layer 41 is formed by implanting C into the vicinity of the surface of the semiconductor substrate 2 by the ion implantation method. Most of C can be implanted into the interstitial site in the Si crystal by using the ion implantation method.

An example of a method of fabricating a semiconductor device 400 according to the present embodiment will be described hereinafter.

Figure 7A:
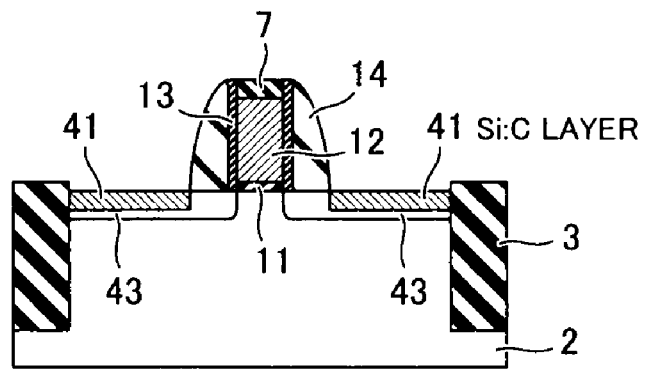
FIGS. 7A to 7C are cross sectional views showing processes for fabricating the semiconductor device according to the fourth embodiment.
Figure 7B:
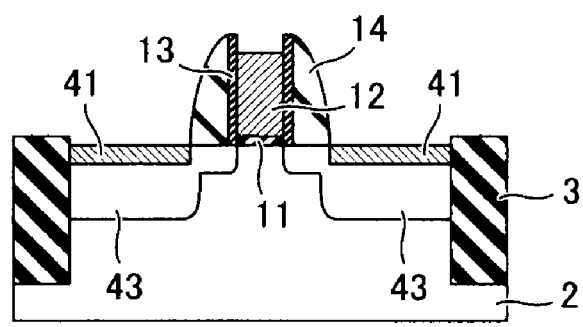
Figure 7C:
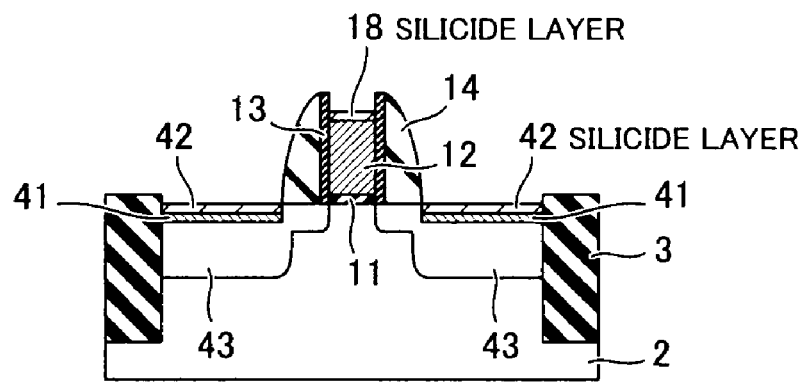

FIGS. 7A to 7C are cross sectional views showing processes for fabricating the semiconductor device 400 according to the fourth embodiment.

Firstly, the processes until the process, shown in FIGS. 2A to 2C, for forming the gate sidewall 14 are carried out in the same way as the first embodiment. Note that, a shallow region of a source/drain region 43 is formed by the same method as the shallow region of the source/drain region 19 in the first embodiment.

Next, as shown in FIG. 7A, C is implanted into the semiconductor substrate 2 by the ion implantation method using the cap film 7, the offset spacers 13 and the gate sidewalls 14 as a mask, thereby forming the Si:C layers 41.

Next, as shown in FIG. 7B, a deep high-concentration region of the p-type source/drain region 43 is formed after removing the cap film 7.

Next, as shown in FIG. 7C, the silicide layers 42 and the silicide layer 18 are respectively formed on the Si:C layers 41 and the gate electrode 12.

An example of a method of forming the silicide layers 42 and 18 made of Ni silicide will be described hereinafter. Firstly, the natural oxide films on the Si:C layers 41 and on the gate electrode 12 are removed by dilute hydrofluoric acid treatment. Next, after forming a Ni film on the whole surface of the semiconductor substrate 2 by a sputtering method, etc., silicidation reaction is generated between the Ni film and the Si:C layer 41 and between the Ni film and the gate electrode 12 by heat treatment such as the RTA, etc., under the temperature condition of 400-500° C., which results in that the silicide layers 42 and 18 are formed. Next, an unreacted portion of the Ni film is removed using a mixed solution of sulfuric acid and hydrogen peroxide solution.

After that, the interlayer insulating films 4a, 4b, the contact plug 6 and the capacitor 5, etc., are formed in the same way as the first embodiment.

Effect of the Fourth Embodiment

According to the fourth embodiment, while improving the thermal stability of the silicide layer 42 by forming the Si:C layer 41 using the ion implantation method, it is possible to suppress the decrease in the carrier mobility by reducing a strain in the channel region.

Fifth Embodiment

The fifth embodiment is different from the first embodiment in that an n-type MOSFET is formed on the semiconductor substrate in addition to the p-type MOSFET. Note that, the explanation will be omitted or simplified for the same points as the first embodiment.

Figure 8:
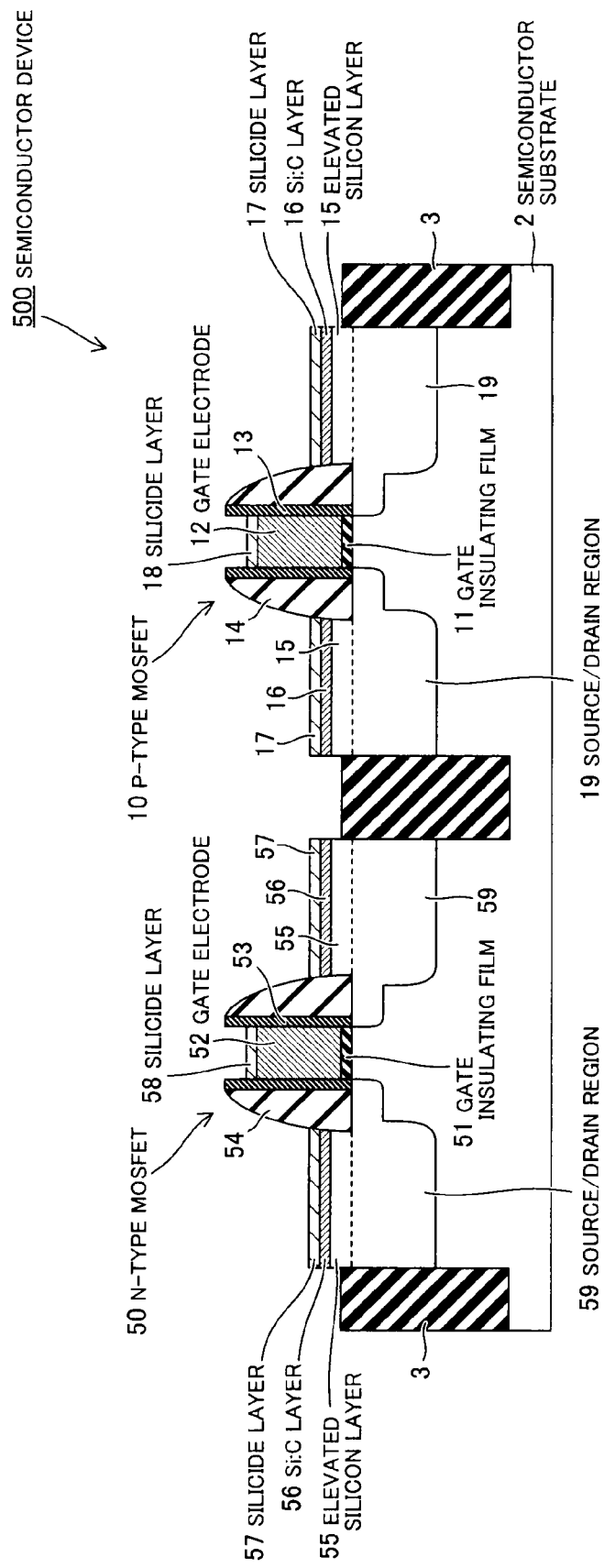
FIG. 8 is a cross sectional view showing a semiconductor device according to a fifth embodiment.

FIG. 8 is a cross sectional view showing a semiconductor device 500 according to a fifth embodiment. The semiconductor device 500 includes a p-type MOSFET 10 and an n-type MOSFET 50 formed on the semiconductor substrate 2, and an element isolation region 3 for respectively isolating the p-type MOSFET 10 and the n-type MOSFET 50 from other elements. Here, the p-type MOSFET 10 has the same configuration as the p-type MOSFET 10 in the first embodiment. Note that, illustrations of an interlayer insulating film, etc., formed on the p-type MOSFET 10 and the n-type MOSFET 50 are omitted.

The p-type MOSFET 50 includes a gate electrode 52 formed on the semiconductor substrate 2 via a gate insulating film 51, offset spacers 53 formed on both side faces of the gate electrode 52, gate sidewalls 54 formed on side faces of the offset spacers 53, elevated silicon layers 55 formed on the semiconductor substrate 2 on both sides of the gate sidewalls 54, Si:C layers 56 formed on the elevated silicon layers 55, silicide layers 57 formed on the Si:C layers 56, a silicide layer 58 formed on the gate electrode 52, and n-type source/drain regions 59 formed on the both sides of the gate electrode 52. The n-type MOSFET 50 has the same configuration as the p-type MOSFET 10 except that a conductivity type of an impurity contained in the source/drain region, etc., is n-type. The n-type MOSFET 50 is formed by the same method as the p-type MOSFET 10.

Effect of the Fifth Embodiment

According to the fifth embodiment, in addition to the effect of the first embodiment, it is possible to improve the thermal stability of the silicide layer 58 in the n-type MOSFET 50.

Sixth Embodiment

The sixth embodiment is different from the fourth embodiment in that an n-type MOSFET is formed on the semiconductor substrate in addition to the p-type MOSFET. Note that, the explanation will be omitted or simplified for the same points as the fourth embodiment.

Figure 9:
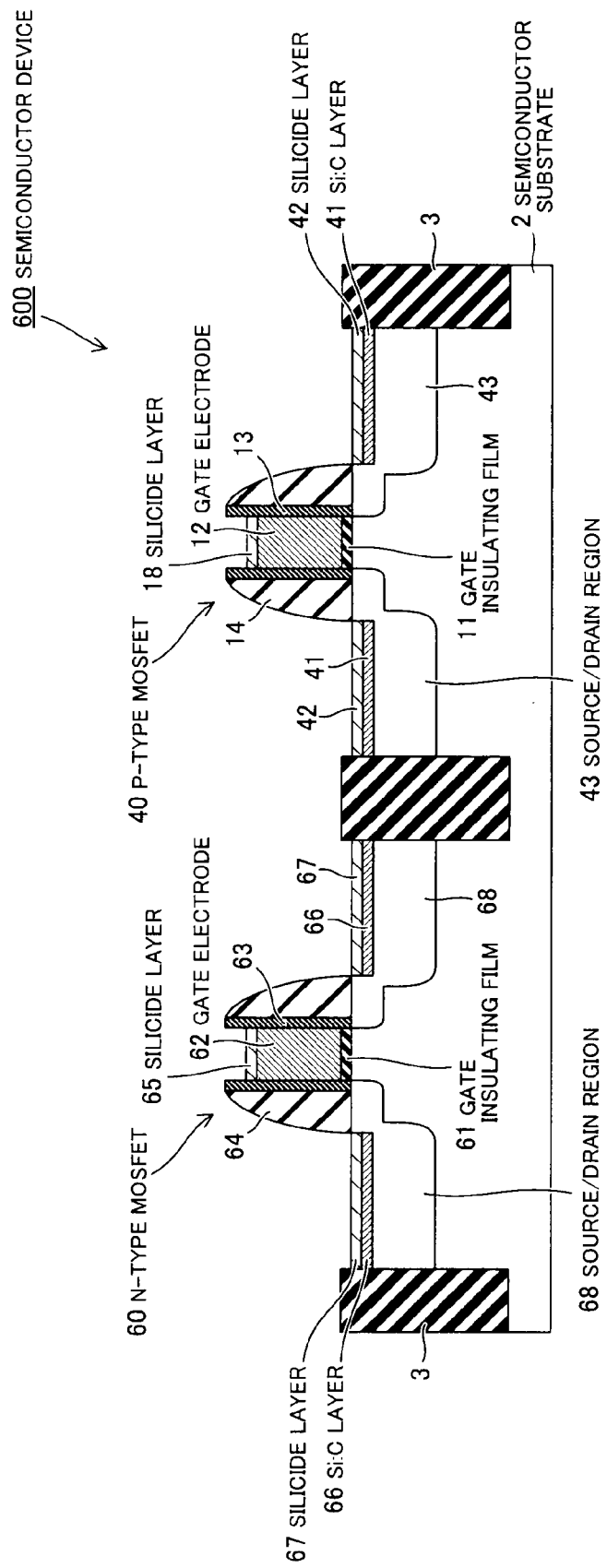
FIG. 9 is a cross sectional view showing a semiconductor device according to a sixth embodiment.

FIG. 9 is a cross sectional view showing a semiconductor device 600 according to a sixth embodiment. The semiconductor device 600 includes the p-type MOSFET 40 and an n-type MOSFET 60 formed on the semiconductor substrate 2, and an element isolation region 3 for respectively isolating the p-type MOSFET 40 and the n-type MOSFET 60 from other elements. Here, the p-type MOSFET 40 has the same configuration as the p-type MOSFET 40 in the fourth embodiment. Note that, illustrations of an interlayer insulating film, etc., formed on the p-type MOSFET 40 and the n-type MOSFET 60 are omitted.

The p-type MOSFET 60 includes a gate electrode 62 formed on the semiconductor substrate 2 via a gate insulating film 61, offset spacers 63 formed on both side faces of the gate electrode 62, gate sidewalls 64 formed on side faces of the offset spacers 63, Si:C layers 66 formed on both sides of the gate sidewalls 64 in the vicinity of the surface of the semiconductor substrate 2, silicide layers 67 formed on the Si:C layers 66, a silicide layer 65 formed on the gate electrode 62, and source/drain regions 68 formed on the both sides of the gate electrode 62. The n-type MOSFET 60 has the same configuration as the p-type MOSFET 40 except that a conductivity type of an impurity contained in the source/drain region, etc., is n-type. The n-type MOSFET 60 is formed by the same method as the p-type MOSFET 40.

Effect of the Sixth Embodiment

According to the sixth embodiment, in addition to the effect of the fourth embodiment, it is possible to improve the thermal stability of the silicide layer 67 in the n-type MOSFET 60.

Seventh Embodiment

The seventh embodiment is different from the third embodiment in that an n-type MOSFET is formed on the semiconductor substrate in addition to the p-type MOSFET. Note that, the explanation will be omitted or simplified for the same points as the third embodiment.

Figure 10:
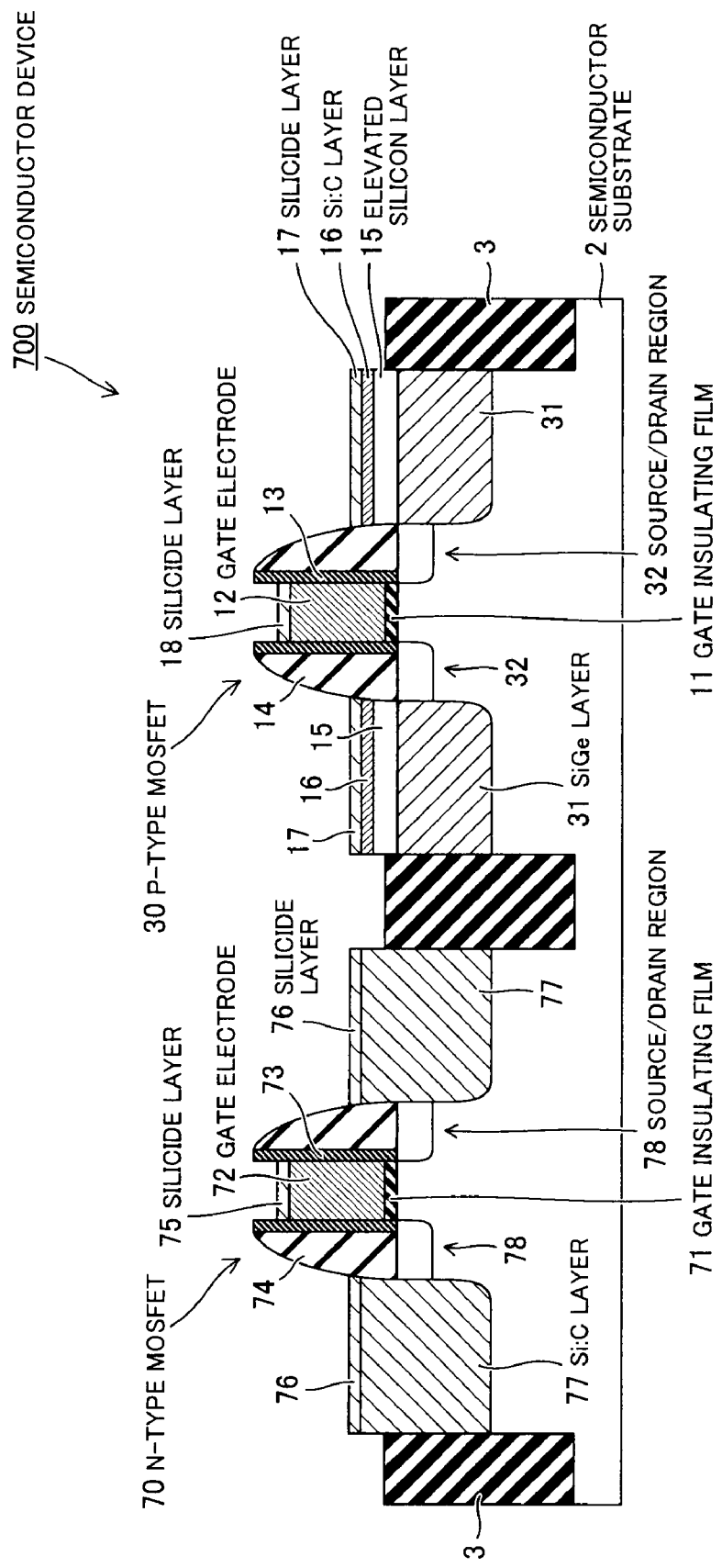
FIG. 10 is a cross sectional view showing a semiconductor device according to a seventh embodiment.

FIG. 10 is a cross sectional view showing a semiconductor device 700 according to the seventh embodiment. The semiconductor device 700 includes a p-type MOSFET 30 and an n-type MOSFET 70 formed on the semiconductor substrate 2, and an element isolation region 3 for respectively isolating the p-type MOSFET 30 and the n-type MOSFET 70 from other elements. Here, the p-type MOSFET 30 has the same configuration as the p-type MOSFET 30 in the third embodiment. Note that, illustrations of an interlayer insulating film, etc., formed on the p-type MOSFET 30 and the n-type MOSFET 70 are omitted.

The p-type MOSFET 70 includes a gate electrode 72 formed on the semiconductor substrate 2 via a gate insulating film 71, offset spacers 73 formed on both side faces of the gate electrode 72, gate sidewalls 74 formed on side faces of the offset spacers 73, source/drain regions 78 formed on both sides of the gate electrode 72, Si:C layers 77 embedded in regions corresponding to deep high-concentration regions of the source/drain regions 78, silicide layers 76 formed on the Si:C layers 77, and a silicide layer 75 formed on the gate electrode 72.

Since the Si:C crystal has a lattice constant smaller than that of the Si crystal, the Si:C crystal generates a strain in the Si crystal which lattice matches with the Si:C crystal. Thus, the Si:C layer 77 generates a tensile strain in a channel direction in the channel region of the n-type MOSFET 70, and it is thereby possible to increase carrier (electron) mobility. Alternatively, a layer made of a crystal other than the Si:C crystal having a lattice constant smaller than that of the Si crystal may be used instead of the Si:C layer 77.

A concentration of C contained in the Si:C layer 77 is preferably 0.05-3.0 At %. This is because, when the C concentration is lower than 0.05 At %, a strain generated in the channel region of the n-type MOSFET 70 is weakened, and when the C concentration is higher than 3.0 At %, crystal defects are more likely to be generated. In addition, the Si:C layer 77 is used as a portion of the source/drain region 78.

An example of a method of fabricating a semiconductor device 700 according to the present embodiment will be described hereinafter.

FIGS. 11A to 11D are cross sectional views showing processes for fabricating the semiconductor device 700 according to the seventh embodiment.

Figure 11A:
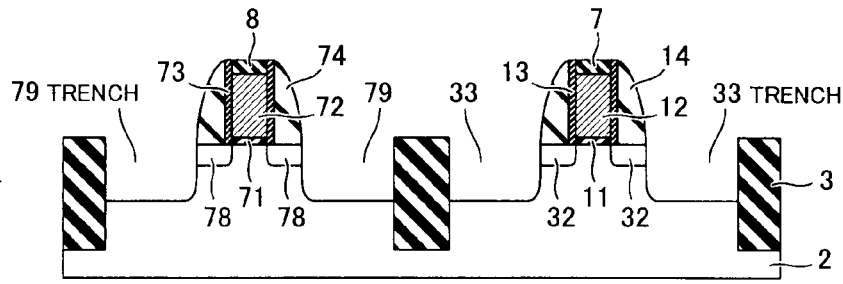
FIGS. 11A to 11D are cross sectional views showing processes for fabricating the semiconductor device according to the seventh embodiment.

Firstly, as shown in FIG. 11A, the processes until the process, shown in FIG. 5A, for forming the trench 33 are carried out in the same way as the third embodiment, and then, the trenches 33 as well as trenches 79 on the both sides of the gate electrode 72 are formed. The trenches 33 and trenches 79 are simultaneously formed by etching the semiconductor substrate 2 using the cap film 7, a cap film 8 on the gate electrode 72, the offset spacers 13, 73, and the gate sidewalls 14, 74 as a mask.

Figure 11B:
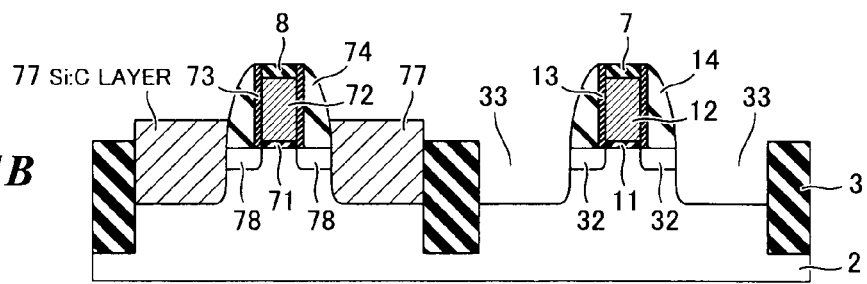

Next, as shown in FIG. 11B, a Si:C crystal is selectively epitaxially grown so as to fill up the trenches 79 using the surface of the semiconductor substrate 2 exposed by the trenches 79 as a base, which results in that the Si:C layers 77 are formed.

At this time, the surface of the semiconductor substrate 2 exposed by the trench 33 is covered by a mask so that a Si:C crystal is not grown in the trench 33. This mask is removed after forming the Si:C layer 77. Note that, in situ doping of an n-type impurity may be carried out when growing the Si:C crystal.

Figure 11C:
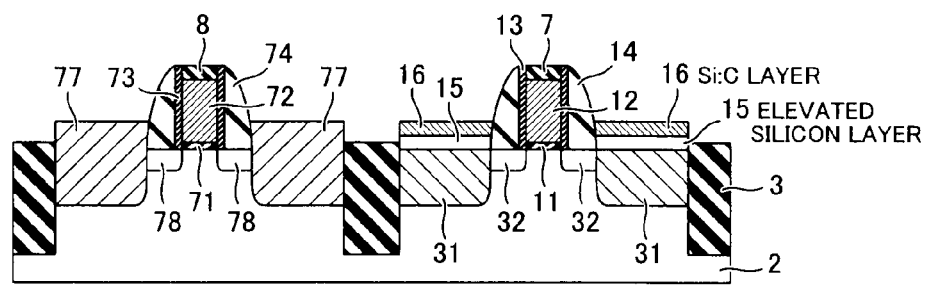

Next, as shown in FIG. 11C, a SiGe crystal is selectively epitaxially grown so as to fill up the trenches 33 using the surface of the semiconductor substrate 2 exposed by the trenches 33 as a base, which results in that the SiGe layers 31 are formed. Furthermore, the elevated silicon layer 15 is selectively epitaxially grown using an upper surface of the SiGe layer 31 as a base, and then, the Si:C layer 16 is selectively epitaxially grown using an upper surface of the elevated silicon layer 15 as a base.

At this time, the surface of the Si:C layer 77 is covered by a mask so that a SiGe crystal is not grown on the Si:C layer 77. This mask is removed after forming the Si:C layer 16. Note that, in situ doping of a p-type impurity may be carried out when growing the SiGe crystal.

Figure 11D:
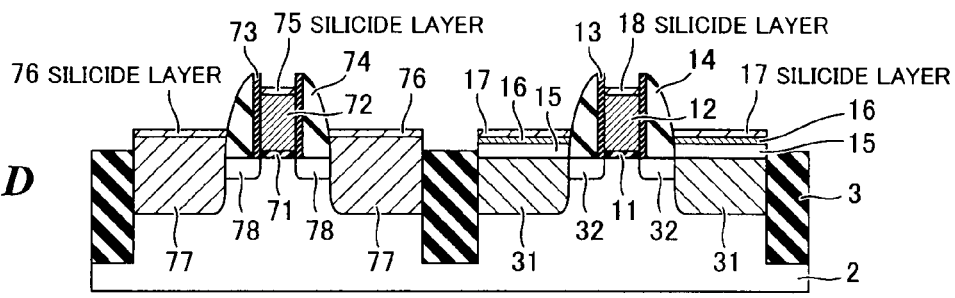

Next, as shown in FIG. 11D, the deep high-concentration regions of the p-type source/drain region 32 and the n-type source/drain region 78 are formed after removing the cap films 7 and 8, and the silicide layers 17, 18, 75 and 76 are further formed.

Concretely, an n-type impurity is selectively implanted into the Si:C layer 77 by the ion implantation method using the offset spacers 73 and the gate sidewalls 74 as a mask, which results in that the deep high-concentration region of the n-type source/drain region 78 is formed.

At this time, the surfaces of the Si:C layer 16, the elevated silicon layer 15, the SiGe layer 31 and the gate electrode 12 are covered by a mask so that the n-type impurity is not implanted thereinto. This mask is removed after implanting the n-type impurity.

On the other hand, a p-type impurity is selectively implanted into the Si:C layer 16, the elevated silicon layer 15 and the SiGe layer 31 by the ion implantation method using the offset spacers 13 and the gate sidewalls 14 as a mask, which results in that the deep high-concentration region of the p-type source/drain region 32 is formed. Furthermore, heat treatment such as spike annealing, etc., is carried out for activating the conductivity type impurities in the source/drain regions 32 and 78.

At this time, the surfaces of the Si:C layer 77 and the gate electrode 72 are covered by a mask so that the p-type impurity is not implanted thereinto. This mask is removed after implanting the p-type impurity.

An example of a method of forming the silicide layers 17, 18, 75 and 76 made of Ni silicide will be described hereinafter. Firstly, the natural oxide films on the Si:C layers 16, the Si:C layer 77, the gate electrodes 12 and 72 are removed by dilute hydrofluoric acid treatment. Next, after forming a Ni film on the whole surface of the semiconductor substrate 2 by the sputtering method, etc., silicidation reaction is respectively generated between the Ni film and the Si:C layer 16, between the Ni film and the gate electrode 12, between the Ni film and the Si:C layer 77 and between the Ni film and the gate electrode 72 by heat treatment such as the RTA, etc., under the temperature condition of 400-500° C., which results in that the silicide layers 17, 18, 75 and 76 are formed. Next, an unreacted portion of the Ni film is removed using a mixed solution of sulfuric acid and hydrogen peroxide solution.

Effect of the Seventh Embodiment

According to the seventh embodiment, by forming the Si:C layer 77, it is possible to obtain an effect of increasing the carrier mobility of the n-type MOSFET 70 in addition to the effect of the third embodiment.

Other Embodiments

It should be noted that the embodiment is not intended to be limited to the above-mentioned first to seventh embodiments, and the various kinds of changes thereof can be implemented by those skilled in the art without departing from the gist of the invention.

In addition, the constituent elements of the above-mentioned embodiments can be arbitrarily combined with each other without departing from the gist of the invention.

What is claimed is:

1. A semiconductor device, comprising: a gate electrode formed on a semiconductor substrate via a gate insulating film; Si:C layers formed on the semiconductor substrate on sides of the gate electrode; p-type source/drain regions formed on sides of the gate electrode in the semiconductor substrate, and a part of the p-type source/drain regions being formed in the Si:C layers; silicide layers formed on the Si:C layers; an elevated layer formed in a region on the semiconductor substrate under the Si:C layers, an upper surface of the elevated layer being located higher than an interface between the semiconductor substrate and the gate insulating film; and a crystal layer formed on sides of the gate electrode in the semiconductor substrate and comprising a crystal having a lattice constant larger than that of a Si crystal, wherein the elevated layer is formed in a region on the crystal layer under the Si:C layers, and wherein the p-type source/drain regions are formed in the semiconductor substrate, the crystal layer, the elevated layer and the Si:C layers.

2. The semiconductor device according to claim 1, wherein the silicide layers are formed on the Si:C layers, in the Si:C layers and in the elevated layer.

3. The semiconductor device according to claim 2, wherein a C concentration at a substitution site of the Si crystal in the Si:C layers is 0.05 At % or less.

4. The semiconductor device according to claim 1, wherein a bottom of the Si:C layers is located higher than an interface between the semiconductor substrate and the gate insulating film.

5. The semiconductor device according to claim 1, wherein a C concentration at a substitution site of the Si crystal in the Si:C layers is 0.05 At % or less.

6. The semiconductor device according to claim 1, wherein the silicide layers are formed on the Si:C layers and in the Si:C layers.

7. The semiconductor device according to claim 1, wherein a C concentration at a substitution site of the Si crystal in the Si:C layers is 0.05 At % or less.

8. The semiconductor device according to claim 1, further comprising: an n-type transistor including another gate electrode formed on the semiconductor substrate via another gate insulating film, other Si:C layers formed on sides of the other gate electrode on the semiconductor substrate, n-type source/drain regions formed on sides of the other gate electrode in the semiconductor substrate and in the other Si:C layers, and other silicide layers formed on the other Si:C layers.

9. The semiconductor device according to claim 2, further comprising: an n-type transistor including another gate electrode formed on the semiconductor substrate via another gate insulating film, other Si:C layers formed on sides of the other gate electrode on the semiconductor substrate, n-type source/drain regions formed on sides of the other gate electrode in the semiconductor substrate and in the other Si:C layers, and other silicide layers formed on the other Si:C layers.

10. The semiconductor device according to claim 7, further comprising: an n-type transistor including another gate electrode formed on the semiconductor substrate via another gate insulating film, other Si:C layers formed on sides of the other gate electrode in the semiconductor substrate, n-type source/drain regions formed on sides of the other gate electrode in the semiconductor substrate and in the other Si:C layers, and other silicide layers formed on the other Si:C layers.

11. A method of fabricating a semiconductor device, comprising: forming a gate electrode on a semiconductor substrate via a gate insulating film; forming Si:C layers on the semiconductor substrate on sides of the gate electrode, or, by an ion implantation method, on sides of the gate electrode in the vicinity of the surface of the semiconductor substrate; forming at least a portion of a source/drain region by implanting a p-type impurity into the Si:C layers and the semiconductor substrate; forming silicide layers by siliciding at least a portion of the Si:C layers; forming an elevated layer on the semiconductor substrate on sides of the gate electrode so that the upper surface of the elevated layer is located higher than an interface between the semiconductor substrate and the gate insulating film, the Si:C layers being formed on the elevated layer; and forming a crystal layer on sides of the gate electrode in the semiconductor substrate, the crystal layer comprising a crystal having a lattice constant larger than that of a Si crystal, the elevated layer being formed on the crystal layer.

12. The method of fabricating a semiconductor device according to claim 11, wherein the crystal having a lattice constant larger than that of a Si crystal is a SiGe crystal.

13. The method of fabricating a semiconductor device according to claim 11, wherein the silicide layers are formed by siliciding the Si:C layers and the elevated layer, such that the silicide layers reach the elevated layer.

14. The method of fabricating a semiconductor device according to claim 11, wherein the silicide layers are formed by siliciding the Si:C layers, such that the silicide reaction reaches a bottom of the Si:C layers.

* * * * *